US010332596B2

(12) United States Patent
Tandingan et al.

(10) Patent No.: US 10,332,596 B2
(45) Date of Patent: *Jun. 25, 2019

(54) 2T1C FERRO-ELECTRIC RANDOM ACCESS MEMORY CELL

(71) Applicant: Cypress Semiconductor Corporation, San Jose, CA (US)

(72) Inventors: Joseph S. Tandingan, Colorado Springs, CO (US); Fan Chu, Colorado Springs, CO (US); Shan Sun, Monument, CO (US); Jesse J. Siman, San Jose, CA (US); Jayant Ashokkumar, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/056,874

(22) Filed: Aug. 7, 2018

(65) Prior Publication Data

US 2019/0088320 A1    Mar. 21, 2019

Related U.S. Application Data

(63) Continuation of application No. 15/714,912, filed on Sep. 25, 2017, now Pat. No. 10,074,422.

(Continued)

(51) Int. Cl.
*G11C 13/00* (2006.01)
(52) U.S. Cl.
CPC ........ *G11C 13/004* (2013.01); *G11C 13/0026* (2013.01); *G11C 13/0028* (2013.01); *G11C 2013/0054* (2013.01)

(58) Field of Classification Search
CPC .................................................... G11C 13/004
See application file for complete search history.

(56) References Cited

U.S. PATENT DOCUMENTS 4,888,733 A    12/1989    Mobley
5,959,922 A    9/1999    Jung
(Continued)

FOREIGN PATENT DOCUMENTS

WO    2002052572 A1    7/2002

OTHER PUBLICATIONS

International Search Report for International Application No. PCT/US18/32404 dated Jun. 25, 2018; 3 pages.

(Continued)

*Primary Examiner* — Tri M Hoang

(57) ABSTRACT

A memory device and method of operating the same are disclosed. Generally, the device includes an array of Ferroelectric Random Access Memory cells. Each cell includes a first transistor coupled between a bit-line and a storage node (SN) and controlled by a first wordline (WL1), a second transistor coupled between a reference line and the SN and controlled by a second wordline (WL2), and a ferro-capacitor coupled between the SN and a plateline. The device further includes a sense-amplifier coupled to the bit-line and reference line, and a processing-element configured to issue control signals to WL1, WL2, the plateline and the sense-amplifier. The cell is configured and operated to generate a bit-level reference in which a first voltage pulse is applied to the plateline during a read cycle for the data pulse and a second voltage pulse serves as a reference pulse and as a clear pulse.

20 Claims, 7 Drawing Sheets

Related U.S. Application Data

(60) Provisional application No. 62/519,042, filed on Jun. 13, 2017.

(56) References Cited

U.S. PATENT DOCUMENTS

| | | | |
|---|---|---|---|
| 6,118,688 A | 9/2000 | Hirano et al. | |
| 6,181,620 B1 | 1/2001 | Agata et al. | |
| 6,341,082 B2 | 1/2002 | Hosoi | |
| 6,404,667 B1 | 6/2002 | Yoo | |
| 6,449,183 B1 | 9/2002 | Hirano et al. | |
| 6,483,737 B2 | 11/2002 | Takeuchi et al. | |
| 6,724,645 B1 | 4/2004 | Lanham et al. | |
| 7,116,572 B2 | 10/2006 | Sun et al. | |
| 7,133,304 B2* | 11/2006 | Madan | G11C 11/22 365/145 |
| 7,180,766 B2 | 2/2007 | Morita | |
| 7,193,880 B2* | 3/2007 | Madan | G11C 11/22 365/145 |
| 7,561,458 B2* | 7/2009 | Madan | G11C 11/22 365/145 |
| 7,643,326 B2* | 1/2010 | Kang | G11C 8/16 365/145 |
| 7,848,132 B2 | 12/2010 | Kim | |
| 7,957,212 B2 | 6/2011 | Kang et al. | |
| 8,064,242 B2 | 11/2011 | Kim | |
| 9,514,797 B1 | 12/2016 | Chu et al. | |
| 9,672,895 B2 | 6/2017 | Antonyan | |
| 10,074,422 B1 | 9/2018 | Tandingan et al. | |
| 2004/0174750 A1 | 9/2004 | Eliason et al. | |
| 2005/0073871 A1 | 4/2005 | Luk et al. | |

OTHER PUBLICATIONS

USPTO Non-Final Rejection for U.S. Appl. No. 15/714,912 dated Nov. 28, 2017; 6 pages.

USPTO Notice of Allowance for U.S. Appl. No. 15/714,912 dated May 11, 2018; 8 pages.

Written Opinion for the International Searching Authority for International Application No. PCT/US18/32404 dated Jun. 25, 2018; 4 pages.

\* cited by examiner

2T1C FERRO-ELECTRIC RANDOM ACCESS MEMORY CELL

CROSS-REFERENCE TO RELATED APPLICATIONS

This application is a continuation of U.S. Non-Provisional patent application Ser. No. 15/714,912, filed Sep. 25, 2017, now U.S. Pat. No. 10,074,422 issued Sep. 11, 2018, which claims the benefit of U.S. Provisional Application No. 62/519,042, filed Jun. 13, 2017, all of which are hereby incorporated by reference herein in their entirety.

TECHNICAL FIELD

This disclosure relates generally to semiconductor memories and more particularly to a Ferro-electric Random Access Memory (F-RAM) including two transistors, one capacitor F-RAM cells having improved signal margins and methods of operating the same.

BACKGROUND

Ferro-electric random-access memories (F-RAM) or memory devices typically include a grid or an array of storage elements or cells, each including at least one ferro-electric capacitor or ferro-capacitor and one or more associated transistors to select the cell and control reading or writing thereto. The ferro-capacitor includes a ferro-electric material, such as Lead Zirconate Titanate (PZT), having a crystal structure with a dipole having two equal and stable polarization states. When an external electric field is applied across the ferro-capacitor, dipoles in the ferro-electric material will align or polarize in the field direction. After the electric field is removed, the dipoles retain their polarization state. This polarization state is read by applying a voltage across the ferro-capacitor through a plateline and a released bit-line initially pre-charged to 0V. The amount of charge generated depends on whether the electric field produced by the applied voltage causes the polarization state of the ferro-electric material to switch. For example, the response of the ferro-capacitor when the polarization is not switched, referred to as the unswitched or U-term, is linear or proportional to the applied voltage, and translates to data '0' when a dataline is connected to the non-inverting side of a sense-amplifier and compared to a reference voltage. The response of the ferro-capacitor when the polarization is switched, referred to as the polarization switching or P-term, is non-linear, typically two times or more greater than the U-term, and translates to data '1' when the dataline is connected to the non-inverting side of a sense-amplifier and compared to the reference voltage.

One problem with conventional F-RAM devices is that precise values for the P-term and U-term can vary for each cell in the array due process variations in the manufacture of the device. Thus, existing F-RAM design which uses a global reference voltage is programmed and placed in between the weakest U-term (one having the highest charge), and the weakest P-term (one having the lowest charge) of any F-RAM cell in the device. Furthermore, these values for the weakest U-term and P-term can vary over the lifetime of the device due to changes in the temperature, voltage and a number of read and/or write cycles the device has experienced. Thus, an effective F-RAM signal margin of conventional F-RAM devices is generally low, and decreases with use, leading to problems with reliability and a reduced operating life.

Accordingly, there is a need for an improved memory device using F-RAM cells and methods for operating the same to maximize signal margin and extend the operating life of the device.

SUMMARY

A semiconductor non-volatile memory device and methods of operating the same are provided. According to embodiments, the memory device includes an array of Ferro-electric Random Access Memory (F-RAM) cells. Generally, each F-RAM cell includes a first or access transistor coupled between a bit-line and a storage node (SN), a second or reference transistor coupled between a reference line and the SN, and a ferro-electric capacitor or ferro-capacitor coupled between the SN and a plateline. The device further includes a sense-amplifier (SA) coupled to the bit-line and the reference line to compare a data voltage on the bit-line to a reference voltage on the reference line, and a processing-element configured to issue control signals to the access transistor, reference transistor and the SA, and to apply voltage pulses to the plateline. Generally, the F-RAM cell is configured according to a bit-level reference scheme in which two pulses are applied to the plateline during a read cycle, and wherein a first of the two pulses is used as a data pulse and a second of the two pulses is used as a reference pulse and as a clear pulse.

According to one embodiment, the processing-element is configured during the read cycle to apply a first pulse with a first peak voltage (V1) to the plateline to couple data from SN to the bit-line, and a second pulse with a second peak voltage (V2) to the plateline to couple the reference voltage to the reference line and to serve as a clear pulse to harden a U-term in the ferro-capacitor.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

Figure 1:
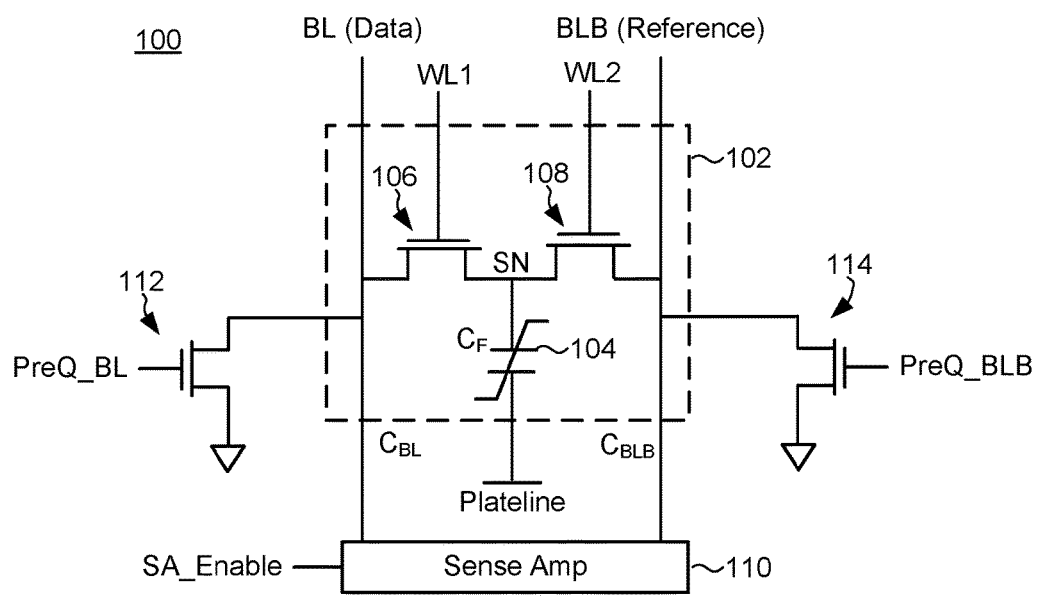
FIG. 1 is a schematic block diagram of a portion of a memory device including a sense amplifier, pre-charge circuits and an embodiment of a two transistors and one ferro-electric capacitor (2T1C) Ferro-electric Random Access Memory (F-RAM) cell.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The terms "Ferro-electric Random Access Memory cell" or "F-RAM cell" are used herein to describe a single memory cell electronic circuit including one or more transistors and a ferro-electric capacitor or ferro-capacitor coupled between a storage node (SN) and a plate line that stores one bit of binary information through switching of polarization states of a ferro-electric material in the ferro-capacitor.

The term "1T1C" as used herein refers to architecture of F-RAM cell including a single transistor and a single ferro-capacitor.

The term "2T1C" as used herein refers to architecture of F-RAM cell including two transistors, i.e., a first or access transistor and a second or reference transistor, and a single ferro-capacitor.

The terms "F-RAM device or "memory device" are used herein to generally describe a memory device including an array of F-RAM cells, as well as a number of sense-amplifiers (SA) coupled to the array through datalines or bit-lines and reference lines to compare a data voltage on the bit-line to a reference voltage on the reference line, and one or more processing-elements or controllers configured to issue control signals to the access transistor, reference transistor and the SA, to apply voltages to the bit-lines and reference lines, and to apply voltage pulses to a plateline of the ferro-capacitor. The processing elements can include registers, multiplexers, command and address circuits, timing controls, and error checking circuits. The processing elements, SA and the array can be integrally formed on a single, integrated circuit (IC), or can include a number of externally coupled discrete devices or ICs.

"U-term" as used herein refers to a linear charge-generated response of the ferro-capacitor when the polarization state is not switched during a read cycle, and which translates to a data '0' when the bit-line is connected to a non-inverting side of the SA.

"P-term" as used herein refers to a non-linear charge-generated response of the ferro-capacitor due to polarization switching during a read cycle, and which translates to a data '1' when the bit-line is connected to a non-inverting side of the SA. Generally, a magnitude of the P-term is two (2) or more times greater than that of the U-term.

Finally, the reference voltage is a voltage applied to the SA for comparison against the data voltage generated by the ferro-capacitor. The data voltage is generated as a result of first voltage (V1) applied across a switching or non-switching ferro-capacitor. The reference voltage is generated as a result of second voltage (V2) applied across a non-switching ferro-capacitor. V2 voltage is set accordingly, typically greater than V1 voltage to create a reference voltage higher than the U-term voltage and lower than the P-term voltage.

Before describing operation of a memory device including an F-RAM cell according to embodiments of the present invention in more detail, it is instructive to present an F-RAM memory cell and environment in which the present embodiments may be implemented.

FIG. 1 illustrates a schematic block diagram of a portion of a memory device 100 including a 2T1C F-RAM cell 102 according to an embodiment of the present disclosure. Referring to FIG. 1, the F-RAM cell 102 includes a single ferro-capacitor 104 coupled between a storage node (SN) and a plateline (PL); a first or access transistor 106 coupled between the SN and a dataline or bit-line BL and controlled by a first wordline (WL1); and a second or reference transistor 108 coupled between the SN and a reference line BLB, controlled by a second wordline (WL2). The 2T1C F-RAM cell 102 utilizes two voltage pulses applied to the plateline PL during a read operation to generate a bit-level reference in which data voltage of the F-RAM cell is compared to a reference voltage based on the U-term of the same cell, that is with a first voltage pulse (1$^{st}$ pulse) being used to generate a data voltage, and a second voltage pulse ($2^{nd}$ pulse) being used to generate the in-cell reference voltage and at the same time can act as a clear signal to the ferro-capacitor to harden a U-term in the ferro-capacitor.

As shown in FIG. 1, the memory device 100 further includes a sense amplifier (SA) 110 to compare a data voltage on the bit-line BL to a reference voltage on the reference line BLB, a first or bit-line pre-charge circuit 112 and a second or reference line pre-charge circuit 114. The bit-line pre-charge circuit 112 is controlled by a processing-element (not shown in this figure) and is configured to pre-charge and release the bit-line BL prior to the application of the $1^{st}$ pulse to the plateline. Preferably, the bit-line pre-charge circuit 112 and the processing-element are further configured to discharge any residual voltage on the SN prior to the $1^{st}$ pulse. The reference line pre-charge circuit 114 is also controlled by the processing-element and is configured to discharge any residual voltage on the SN and release the reference line prior to the application of the $2^{nd}$ pulse to the plateline.

It will be understood that the use of two transistors, i.e., the access transistor 106 and reference transistor 108, to sequentially couple the SN first to the bit-line BL and then to the reference line BLB enables a read operation, in which a pre-charge of the bit-line is not needed in between the first and second voltage pulses, thereby optimizing frequency of operation of the memory device. Additionally, for each bit stored in the F-RAM cell 102, the generated reference voltage tracks the changes in the U-term of the same cell (ferro-capacitor 104), whether these changes are due to process variation in fabricating the cell, due to changes in temperature, or due to wear-out stresses such as endurance cycling and data retention bake over an operational lifetime of the memory device 100, thereby providing a higher F-RAM signal margin and improving or maximizing the life of the memory device as compared with conventional 1T1C F-RAM cells using a global reference voltage.

Figure 2:
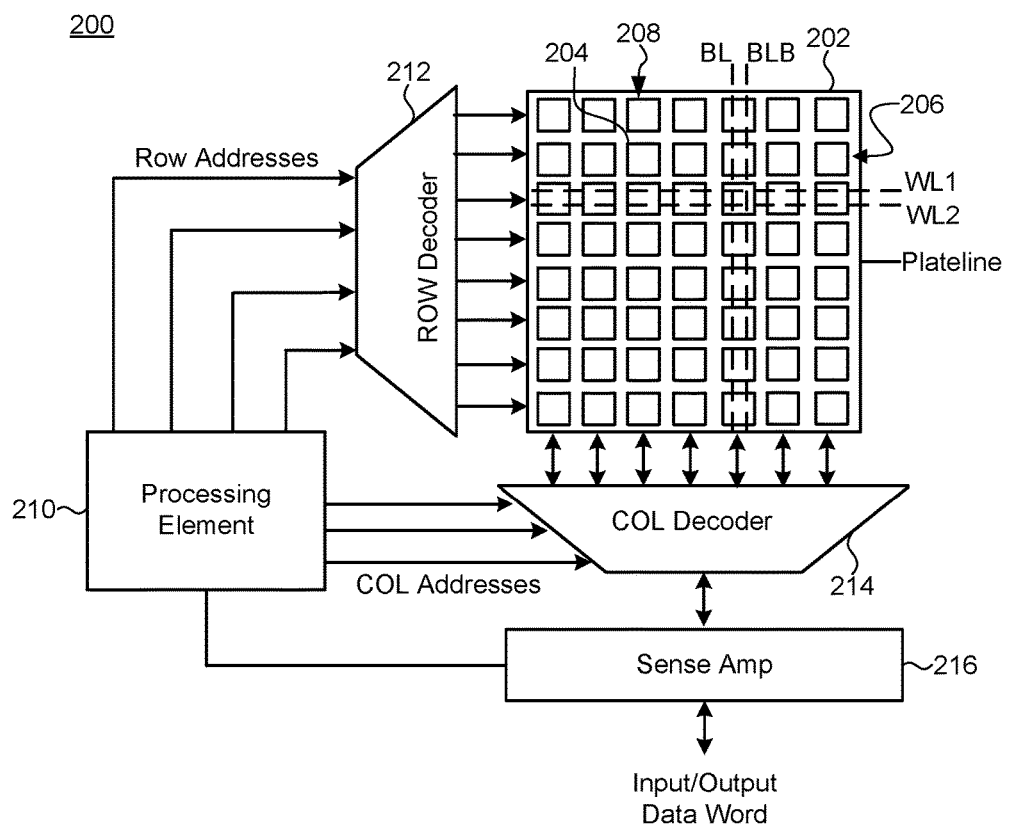
FIG. 2 is a block diagram of an embodiment a memory device including a processing-element and an array of 2T1C F-RAM cells.

FIG. 2 illustrates a simplified block diagram of a memory device 200 including an array 202 of 2T1C F-RAM cells 204 according to an embodiment of the present disclosure arranged in a number of rows 206 each row sharing a first wordline (WL1) and a second wordline (WL2) a number of columns 208 with cells in each column having a common dataline or bit-line (BL) and a reference line BLB. Although not shown it will be understood that cells 204 in adjacent columns can share a bit-line (BL) or reference line (BLB) to reduce the number of lines required and the consequent size of the array 202. Referring to FIG. 2, the memory device 200 further includes a controller or processing element 210, such as a micro-controller, micro-processor or state machine, to issue commands or control signals to each of the F-RAM cells 204 and with other peripheral circuits for reading from or writing to the memory array. Generally, as in the embodiment shown in FIG. 2, the peripheral circuits further include a row decoder 212, a column decoder 214 and a sense amplifier/driver 216.

When a data word is to be stored or written to the memory device 200, the row decoder 212 selects a row of the array 202 and applying an appropriately timed control signal to the first wordlines (WL1) of F-RAM cells 204 in the selected row. The column decoder 214 converts a column address and couples a data voltage from sense amplifier/driver 216 to the bit-line BL of each F-RAM cell 204 while the processing element 210 couples the bit-line BL to the SN in the F-RAM cell. When BL is logic '1' and 0V is applied to the plateline (PL), a logic ' ' 1' is written to the F-RAM cell. When BL is logic '0' and 0V is applied to the PL, the F-RAM cell is not repolarized and therefore remains U-term or logic '0' generated by the clear pulse during the read operation.

Generally, when a data word is to be recalled or read out from the memory device 200 the row decoder 212 converts a row address by applying appropriately timed control signals to the first and second wordlines (WL1 and WL2) of F-RAM cells 204 in a selected row of the array 202. The column decoder 214 converts a column address by coupling a data voltage from the bit-line BL of each F-RAM cell 204 in the selected row generated by a $1^{st}$ pulse applied to the plateline (PL) of the ferro-capacitor (not shown in this figure) in the cell, and then coupling a reference voltage from the reference line BLB of the same cell row generated by a $2^{nd}$ pulse applied to the plateline (PL) to the sense amplifier/driver 216. The sense amplifier/driver 216 compares the data voltage for each F-RAM cell 204 in the selected row to the reference voltage from the same cell to determine whether a logic '0' or ' ' 1' was read from the cell.

Figure 3:
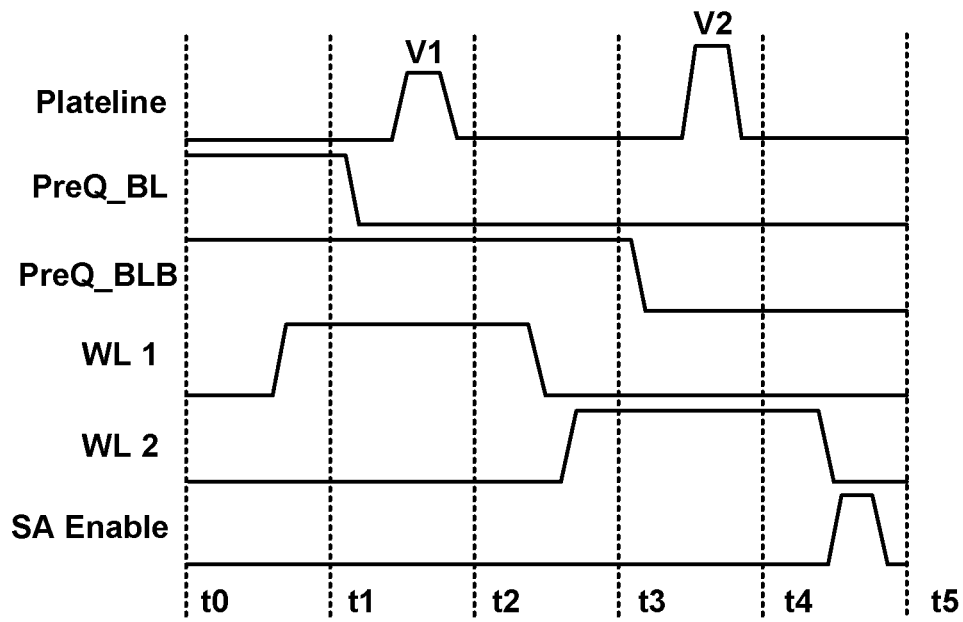
FIG. 3 is a timing diagram for describing an embodiment of a read cycle associated with the 2T1C F-RAM cell of FIG. 1.

A read cycle to read a bit of data from the F-RAM cell 102 of FIG. 1 according to one embodiment of the present disclosure will now be described in greater detail with reference to FIGS. 1 through 3. Referring to FIG. 1, in this embodiment the memory device 100 and the F-RAM cell 102 are configured such that a capacitance ($C_{BL}$) of the bit-line BL is substantially equal to or the same as a capacitance ($C_{BLB}$) of the reference line BLB. Referring to FIG. 3, the magnitude of a first peak voltage (V1) of the $1^{st}$ pulse applied to the plateline to couple data from the SN to the bit-line BL is less than a second peak voltage (V2) of the $2^{nd}$ pulse applied to the plateline to couple a reference voltage to the reference line.

Referring to FIG. 3, at time t0 a PreQ_BL signal is applied to the bit-line pre-charge circuit 112 by the processing element 210 to turn ON the bit-line pre-charge circuit 112 and pre-charge bit-line BL to a predetermined voltage, for example 0V.

From time t0 to time t1 a control signal WL1 is applied to wordline WL1 to turn ON access transistor 106 from default static timing, while bit-line pre-charge circuit 112 remains ON to discharge any residual internal voltage from the storage node SN.

From time t1 to time t2 the bit-line pre-charge circuit 112 is turned OFF to release the bit-line BL, followed by the application of a $1^{st}$ or a data pulse having a peak voltage of V1 to the plateline of the F-RAM cell 102, thereby applying an electric field across the ferro-capacitor 104 and resulting in a bit-line voltage ($V_{BL}$) of:

$$V_{BL}=(V1*C_F)/(C_F+C_{BL})$$

where $V_{BL}$ is the bit-line voltage, V1 is the peak voltage of $1^{st}$ pulse, $C_{BL}$ is a capacitance of the bit-line, and $C_F$ is a capacitance of the ferro-capacitor 104, the value of which depends on whether the polarization state of the ferro-electric material in the ferro-capacitor is switched (P-term, a logic '1') or unswitched (U-term, a logic '0') by application of the electric field.

From time t2 to time t3, the bit-line voltage $V_{BL}$ goes down from on-pulse data voltage to an after-pulse (up-down) data voltage ($U_{UD}$ or $P_{UD}$), which depends on whether the polarization state of the ferro-electric material in the ferro-capacitor 104 has been switched ($P_{UD}$) or unswitched ($U_{UD}$). Wordline WL1 turns OFF decoupling the bit-line BL from the SN, followed by a control signal WL2 is applied to wordline WL2 to turn ON reference transistor 108 from default static timing, while reference line pre-charge circuit 114 remains ON to discharge any residual internal voltage from the storage node SN.

From time t3 to time t4 the reference line pre-charge circuit 114 is turned OFF to release the reference line BLB, followed by the application of a $2^{nd}$ pulse having a peak voltage of V2 to the plateline of the F-RAM cell 102. It is noted that the direction of the electric field applied across the ferro-capacitor 104 as a result of the $2^{nd}$ pulse is the same as that applied by the $1^{st}$ pulse. Thus, the polarization of the ferro-capacitor 104 will be unswitched and the $2^{nd}$ pulse functions as a reference pulse to generate a reference voltage ($V_{BLB}$) on the reference line BLB of:

$$V_{BLB}=(V2*C_{FU})/(C_{FU}+C_{BLB})$$

where $V_{BLB}$ is the reference line voltage, V2 is the peak voltage of $2^{nd}$ pulse, $C_{BLB}$ is a capacitance of the reference line BLB, and $C_{FU}$ is a capacitance of the ferro-capacitor 104 in an unswitched (U-term) polarization state. It is further noted that because the ferro-capacitor 104 remains unswitched, the $2^{nd}$ pulse also functions as a clear pulse.

Finally, from time t4 to time t5 Wordline WL2 turns OFF reference transistor 108 decoupling the reference line BLB from the SN, and a SA enable signal is applied to the SA 110 by the processing element 210 to enable the data voltage ($U_{UD}$ or $P_{UD}$) on the bit-line BL and the reference voltage ($U_{UD}$ or $P_{UD}$) from the same cell 102 and based on the U-term of the ferro-capacitor 104 to be latched in the SA.

Figure 4:
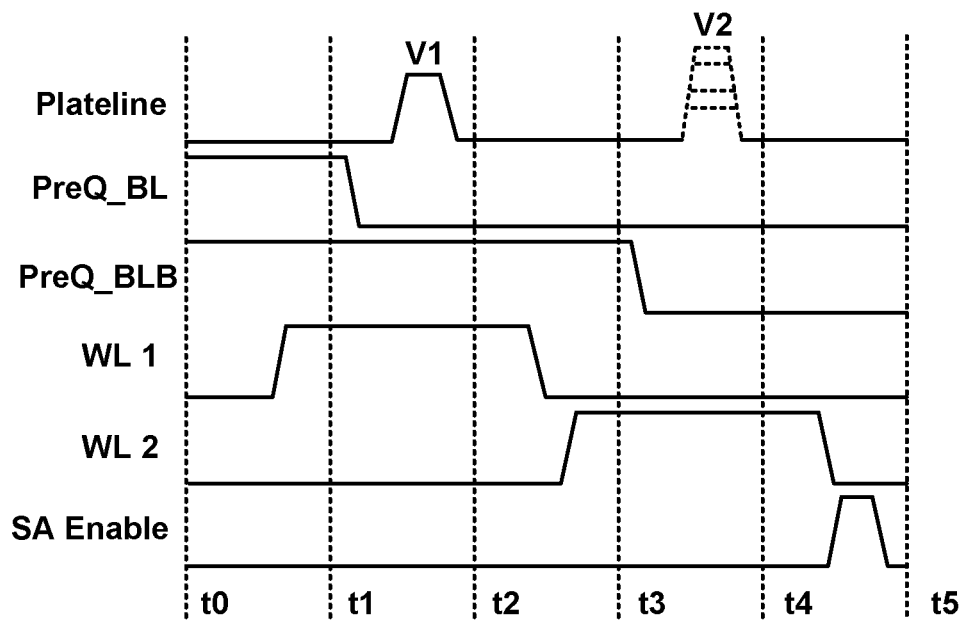
FIG. 4 is a timing diagram for describing another embodiment of a read cycle associated with the 2T1C F-RAM cell of FIG. 1 in which the memory device is configured to provide a margin sweep capability.

A read cycle to read a bit of data from the F-RAM cell of FIG. 1 according to another embodiment of the present disclosure will now be described in greater detail with reference to FIGS. 1, 2 and 4. Referring to FIG. 1, again the memory device 100 and the F-RAM cell 102 are configured such that a capacitance ($C_{BL}$) of the bit-line BL is substantially equal to or the same as a capacitance ($C_{BLB}$) of the reference line BLB. Referring to FIG. 4, in this embodiment the memory device 100 and the F-RAM cell 102 are configured to provide a margin sweep capability in which the magnitude of the voltage V2 of the $2^{nd}$ pulse is variable or swept from 0V to greater than V1, the peak voltage of $1^{st}$ pulse, V2: 0V to >V1. Thus, the level of the data voltage ($V_{BL}$) latched on the bit-line BL where can be either $U_{UD}$ or $P_{UD}$, depending on whether polarization is switched or unswitched can be determined.

Referring to FIG. 4, at time t0 a PreQ_BL signal is applied to the bit-line pre-charge circuit 112 to pre-charge bit-line BL to a predetermined voltage, for example 0V.

From time t0 to time t1 a control signal WL1 is applied to turn ON access transistor 106, while bit-line pre-charge circuit 112 also remains ON, thereby discharging any residual internal voltage from the storage node SN.

From time t1 to time t2 the bit-line pre-charge circuit 112 is turned OFF to release the bit-line BL, followed by the application of a $1^{st}$ pulse having a peak voltage of V1 to the plateline of the F-RAM cell 102, resulting in a bit-line voltage ($V_{BL}$) equal to $(V1*C_F)/(C_F+C_{BL})$.

From time t2 to time t3, the bit-line voltage $V_{BL}$ goes down from on-pulse data voltage to an after-pulse (up-down) data voltage ($U_{UD}$ or $P_{UD}$), depending on whether the polarization state of the ferro-electric material in the ferro-capacitor 104 has been switched, and wordline WL1 is turned OFF decoupling the bit-line BL from the SN, followed by applying a control signal to wordline WL2 to turn ON reference transistor 108. Reference line pre-charge circuit 114 remains ON to discharge any residual internal voltage from the storage node SN.

From time t3 to time t4 the reference line pre-charge circuit 114 is turned OFF to release the reference line BLB, followed by the application of a $2^{nd}$ pulse to the plateline of the F-RAM cell 102 having a peak voltage V2 swept from 0V to >V1. As with the embodiment described above with reference to FIG. 3, the polarization of the ferro-capacitor 104 remains unswitched and the $2^{nd}$ pulse functions as a reference pulse to generate a reference voltage ($V_{BLB}$) on the reference line BLB of:

$$V_{BLB}=(V2*C_{FU})/(C_{FU}+C_{BLB})$$

where $V_{BLB}$ is the reference line voltage, V2 is the peak voltage of $2^{nd}$ pulse, $C_{BLB}$ is a capacitance of the reference line BLB, and $C_{FU}$ is a capacitance of the ferro-capacitor 104 in an unswitched (U-term) polarization state. The variable voltage V2 of $2^{nd}$ pulse, where the voltage can be sweep from 0V to >V1, adds the capability to measure the level of data voltage ($U_{UD}$ or $P_{UD}$). It is further noted that because the ferro-capacitor 104 remains unswitched, the $2^{nd}$ pulse also functions as a clear pulse.

Finally, from time t4 to time t5 Wordline WL2 turns OFF reference transistor 108 decoupling the reference line BLB from the SN, and a SA enable signal is applied to the SA 110 by the processing element 210 to enable the data voltage ($U_{UD}$ or $P_{UD}$) on the bit-line BL and the reference voltage ($U_{UD}^+$) to be latched in the SA.

A read cycle to read a bit of data from the F-RAM cell of FIG. 1 according to yet another embodiment of the present disclosure will now be described in greater detail with reference to FIGS. 1, 2 and 5. As with the embodiments described above with reference to FIGS. 3 and 4, the memory device 100 and the F-RAM cell 102 are configured such that a capacitance ($C_{BL}$) of the bit-line BL is substantially equal to or the same as a capacitance ($C_{BLB}$) of the reference line BLB.

Figure 5:
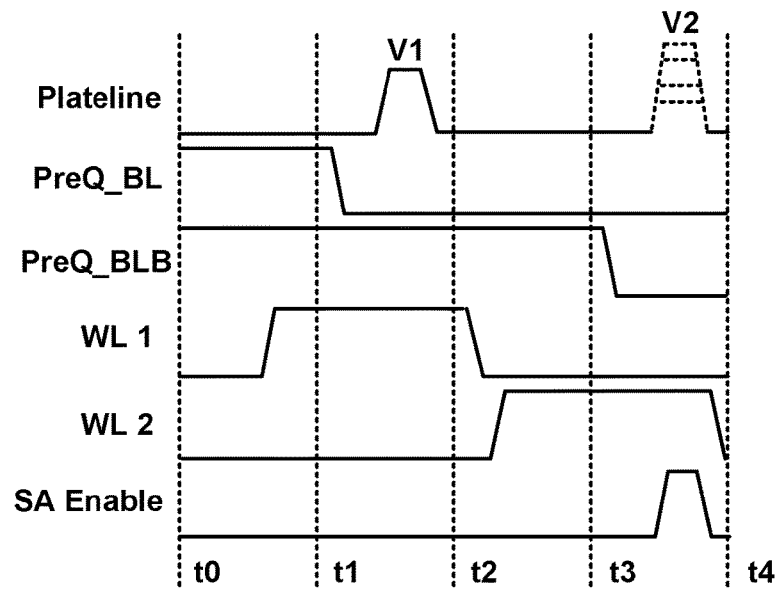
FIG. 5 is a timing diagram for describing yet another embodiment of a read cycle associated with the 2T1C F-RAM cell of FIG. 1 in which the memory device is configured to provide a margin sweep capability and simultaneous reference pulse and sense amplifier enable signals.

However, referring to FIG. 5, in this embodiment the memory device 100 and the F-RAM cell 102 are configured to provide a margin sweep capability in which the magnitude of the voltage V2 of the $2^{nd}$ pulse is variable or swept up from 0V to >V1, and the SA enable signal is applied to the SA 110 during or concurrent with the $2^{nd}$ pulse, thereby eliminating the period from time t4 to time t5, and increasing a frequency of operation of the memory device 100/200.

Referring to FIG. 5, at time t0 a PreQ_BL signal is applied to the bit-line pre-charge circuit 112 to pre-charge bit-line BL to a predetermined voltage, for example 0V.

From time t0 to time t1 a control signal WL1 is applied to turn ON access transistor 106, while bit-line pre-charge circuit 112 also remains ON, thereby discharging any residual internal voltage from the storage node SN.

From time t1 to time t2 the bit-line pre-charge circuit 112 is turned OFF to release the bit-line BL, followed by the application of a $1^{st}$ pulse having a peak voltage of V1 to the plateline of the F-RAM cell 102, resulting in a bit-line voltage ($V_{BL}$) equal to $(V1*C_F)/(C_F+C_{BL})$.

From time t2 to time t3, the bit-line voltage $V_{BL}$ goes down from on-pulse data voltage to an after-pulse (up-down) data voltage ($U_{UD}$ or $P_{UD}$), depending on whether the polarization state of the ferro-electric material in the ferro-capacitor 104 has been switched, and wordline WL1 is turned OFF decoupling the bit-line BL from the SN, followed by applying a control signal to wordline WL2 to turn ON reference transistor 108. Reference line pre-charge circuit 114 remains ON to discharge any residual internal voltage from the storage node SN.

From time t3 to time t4 the reference line pre-charge circuit 114 is turned OFF to release the reference line BLB, followed by the application of a $2^{nd}$ pulse to the plateline of the F-RAM cell 102 having a peak voltage V2 swept from 0V to >V1. Additionally, as described above the SA enable signal is applied to the SA 110 during or concurrent with the $2^{nd}$ pulse to enable the data voltage ($U_{UD}$ or $P_{UD}$) on the bit-line BL and the reference voltage ($U_{UO}$) to be latched in the SA 110, thereby eliminating the period from time t4 to time t5 and increasing a frequency of operation of the memory device 100/200. Finally, Wordline WL2 turns OFF reference transistor 108 decoupling the reference line BLB from the SN.

Figure 6:
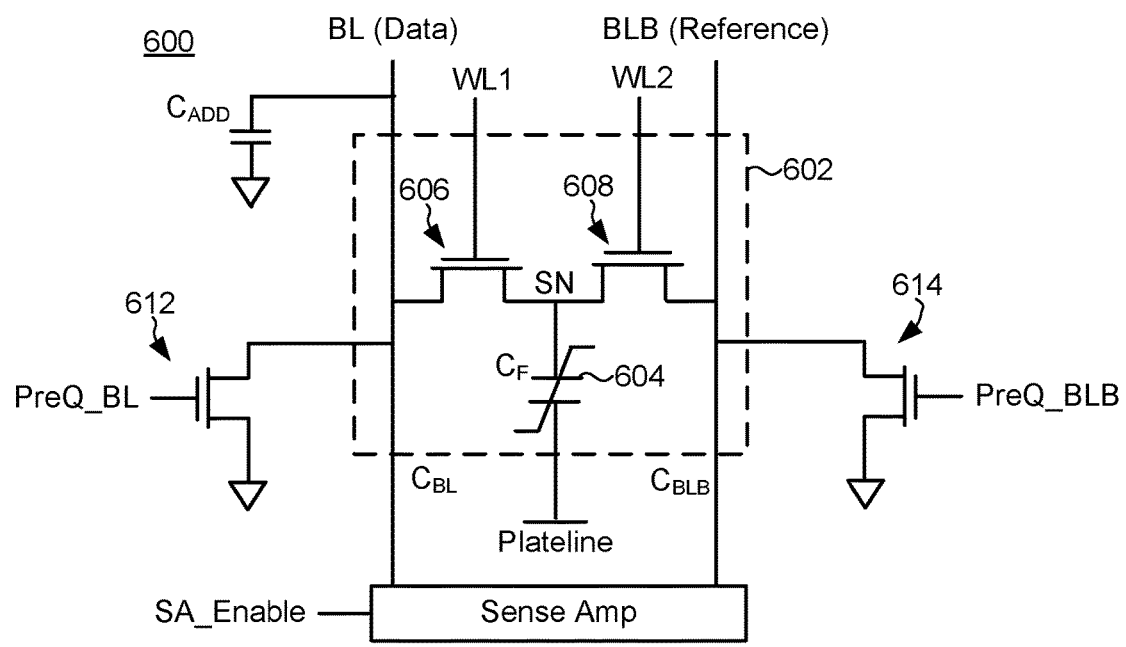
FIG. 6 is a schematic block diagram of a portion of a memory device including 2T1C F-RAM cells and in which a capacitance of the bit-line is greater than the capacitance of the reference line.

FIG. 6 illustrates a portion of a memory device 600 including a 2T1C F-RAM cell 602 according to another embodiment of the present disclosure in which a capacitance of the bit-line is greater than the capacitance of the reference line. Referring to FIG. 6 the F-RAM cell 602 includes a single ferro-capacitor 604 coupled between a storage node (SN) and a plateline (PL); a first or access transistor 606 coupled between the SN and a dataline or bit-line BL and controlled by a first wordline (WL1); and a second or reference transistor 608 coupled between the SN and a reference line BLB, controlled by a second wordline (WL2). The memory device 600 further includes a sense amplifier 610, a first or bit-line pre-charge circuit 612, a second or reference line pre-charge circuit 614 and additional bit-line capacitance ($C_{ADD}$). The additional bit-line capacitance can include one or more discrete capacitors coupled to the bit-line BL as shown in FIG. 6, or can include intrinsic capacitance formed between the bit-line BL and an electrical ground of a substrate (not shown) or IC on which the memory device 600 is fabricated. Because the additional bit-line capacitance ($C_{ADD}$) increases a total capacitance of the bit-line BL is greater than or equal to the reference line BLB capacitance, $(C_{BL}+C_{ADD})\geq C_{BLB}$. The goal of this cell configuration is to reduce the complexity of the PL source voltage because the reference voltage can be generated with V2 the same voltage as V1 at the expense of P-term margin being lower equal to $(V1*C_F)/(C_F+C_{BL}+C_{ADD})$ compared to cell configuration 100.

Figure 7:
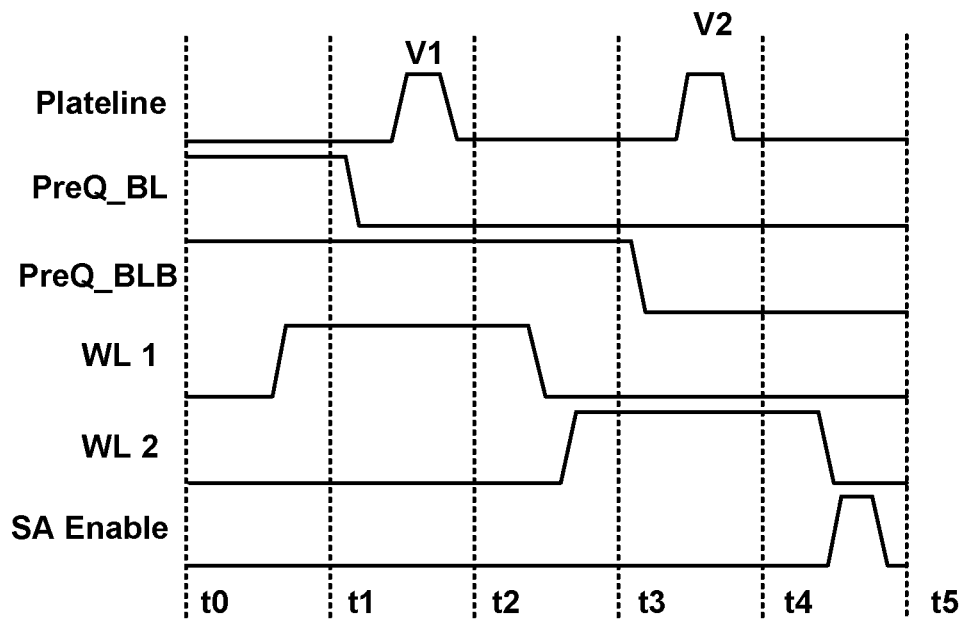
FIG. 7 is a timing diagram for describing an embodiment of a read cycle associated with the 2T1C F-RAM cell of FIG. 6.

A read cycle to read a bit of data from the F-RAM cell of FIG. 6 according to an embodiment of the present disclosure will now be described in greater detail with reference to FIGS. 2, 6 and 7. Referring to FIG. 6, again the memory device 600 and the F-RAM cell 602 are configured such that the additional bit-line capacitance ($C_{ADD}$) increases a total capacitance of the bit-line BL so that it is greater than the reference line BLB capacitance, $(C_{BL}+C_{ADD})\geq C_{BLB}$. However, referring to FIG. 7, in this embodiment the magnitude of a first peak voltage (V1) of the $1^{st}$ pulse is equal to or substantially the same as the magnitude of a second peak voltage (V2) of the $2^{nd}$ pulse.

Referring to FIG. 6, at time t0 a PreQ_BL signal is applied to the bit-line pre-charge circuit 612 by the processing element 210 to turn ON the bit-line pre-charge circuit and pre-charge bit-line BL to a predetermined voltage, for example 0V.

From time t0 to time t1 a control signal WL1 is applied to wordline WL1 to turn ON access transistor 606 from default static timing, while bit-line pre-charge circuit 612 remains ON to discharge any residual internal voltage from the storage node SN.

From time t1 to time t2 the bit-line pre-charge circuit 612 is turned OFF to release the bit-line BL, followed by the application of a $1^{st}$ or a data pulse having a peak voltage of V1 to the plateline of the F-RAM cell 602, thereby applying an electric field across the ferro-capacitor 604 and resulting in a bit-line voltage ($V_{BL}$) of:

$$V_{BL}=(V1*C_F)/(C_F+C_{BL}+C_{ADD})$$

where $V_{BL}$ is the bit-line voltage, V1 is the peak voltage of $1^{st}$ pulse, $C_{BL}$ is a capacitance of the bit-line BL, $C_{ADD}$ is the additional bit line capacitance, and $C_F$ is a capacitance of the ferro-capacitor 604, the value of which depends on whether the polarization state of the ferro-electric material in the ferro-capacitor is switched (P-term) or unswitched (U-term).

From time t2 to time t3 bit-line voltage $V_{BL}$ goes down from on-pulse data voltage to an after-pulse (up-down) data voltage ($U_{UD}$ or $P_{UD}$), which depends on whether the polarization state of the ferro-electric material in the ferro-capacitor 604 has been switched ($P_{UD}$) or unswitched ($U_{UD}$). Wordline WL1 turns OFF decoupling the bit-line BL from the SN, followed by a control signal WL2 is applied to wordline WL2 to turn ON reference transistor 608 from default static timing, while reference line pre-charge circuit 614 remains ON to discharge any residual internal voltage from the storage node SN.

From time t3 to time t4 the reference line pre-charge circuit 614 is turned OFF to release the reference line BLB, followed by the application of a $2^{nd}$ pulse having a peak voltage of V2 to the plateline of the F-RAM cell 602. It is noted that the direction of the electric field applied across the ferro-capacitor 604 as a result of the $2^{nd}$ pulse is the same as that applied by the $1^{st}$ pulse. Thus, the polarization of the ferro-capacitor 604 will be unswitched and the $2^{nd}$ pulse functions as a reference pulse to generate a reference voltage ($V_{BLB}$) on the reference line BLB of:

$$V_{BLB}=(V2*C_{FU})/(C_{FU}+C_{BLB})$$

where $V_{BLB}$ is the reference line voltage, V2 is the peak voltage of $2^{nd}$ pulse and is equal to V1, $C_{BLB}$ is a capacitance of the reference line BLB, and $C_{FU}$ is a capacitance of the ferro-capacitor 604 in an unswitched (U-term) polarization state. It is further noted that because the ferro-capacitor 604 remains unswitched, the $2^{nd}$ pulse also functions as a clear pulse.

Finally, from time t4 to time t5 Wordline WL2 turns OFF reference transistor 608 decoupling the reference line BLB from the SN, and a SA enable signal is applied to the SA 610 by the processing element 210 to enable the data voltage ($U_{UD}$ or $P_{UD}$) on the bit-line BL and the reference voltage from the same cell 602 and based on the U-term of the ferro-capacitor 604 to be latched in the SA.

A read cycle to read a bit of data from the F-RAM cell of FIG. 6 according to another embodiment of the present disclosure will now be described in greater detail with reference to FIGS. 2, 6 and 8. Referring to FIG. 6, again the memory device 600 and the F-RAM cell 602 are configured such that the additional bit-line capacitance ($C_{ADD}$) increases a total capacitance of the bit-line BL so that $(C_{BL}+C_{ADD})\geq C_{BLB}$.

Figure 8:
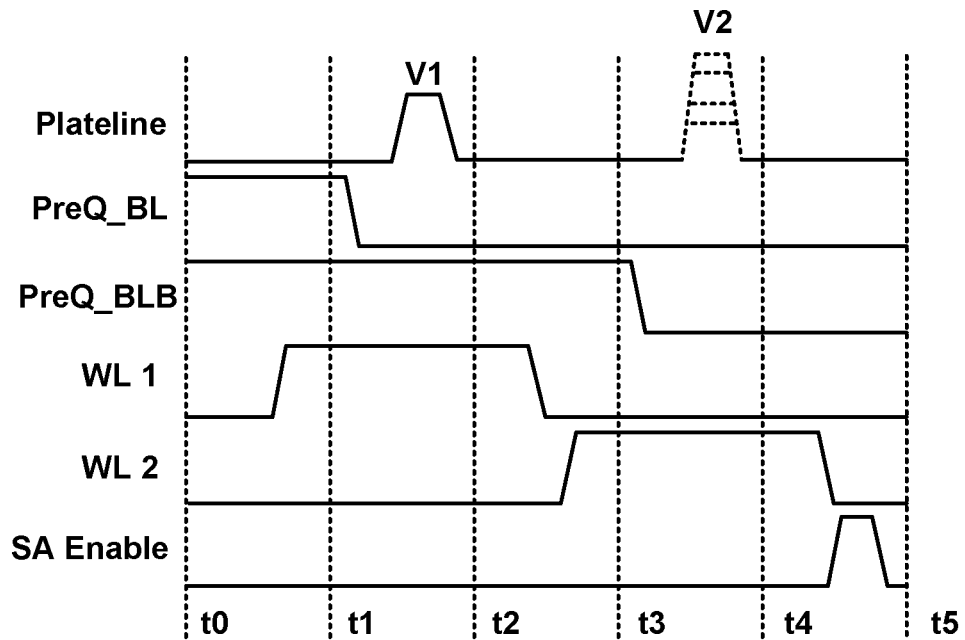
FIG. 8 is a timing diagram for describing another embodiment of a read cycle associated with the 2T1C F-RAM cell of FIG. 6 in which the memory device is configured to provide a margin sweep capability.

However, referring to FIG. 8, in this embodiment the memory device 600 and the F-RAM cell 602 are also configured to provide a margin sweep capability in which the magnitude of the voltage V2 of the $2^{nd}$ pulse is variable or swept from 0V to >V1. The data voltage ($V_{BL}$) latched on the bit-line BL can be either $U_{UD}$ or $P_{UD}$, depending on whether polarization is switched or unswitched, the voltage V2 of $2^{nd}$ pulse can be swept up or down from 0V to >V1 for margin measurement, and to finalize the reference voltage ($V_{BLB}$) to $U_{UD}$ such that $P_{UD}>U_{UD}>U_{UD}$, where $P_{UD}$ is data voltage on the bit-line BL of the F-RAM cell 602 when polarization is switched, and $U_{UD}$ is data voltage on the bit-line BL of the F-RAM cell 602 when polarization is unswitched, and $U_{UD}$ is the final reference voltage.

Referring to FIG. 8, at time t0 a PreQ_BL signal is applied to the bit-line pre-charge circuit 612 to pre-charge bit-line BL to a predetermined voltage, for example 0V.

From time t0 to time t1 a control signal WL1 is applied to turn ON access transistor 606, while bit-line pre-charge circuit 612 also remains ON, thereby discharging any residual internal voltage from the storage node SN.

From time t1 to time t2 the bit-line pre-charge circuit 612 is turned OFF to release the bit-line BL, followed by the application of a $1^{st}$ pulse having a peak voltage of V1 to the plateline of the F-RAM cell 602, resulting in a bit-line voltage ($V_{BL}$) equal to $(V1*C_F)/(C_F+C_{BL}+C_{ADD})$.

From time t2 to time t3 bit-line voltage $V_{BL}$ goes down from on-pulse data voltage to an after-pulse (up-down) data voltage ($U_{UD}^-$ or $P_{UD}^-$), depending on whether the polarization state of the ferro-electric material in the ferro-capacitor 604 has been switched, and wordline WL1 is turned OFF decoupling the bit-line BL from the SN, followed by applying a control signal to wordline WL2 to turn ON reference transistor 608. Reference line pre-charge circuit 614 remains ON to discharge any residual internal voltage from the storage node SN.

From time t3 to time t4 the reference line pre-charge circuit 614 is turned OFF to release the reference line BLB, followed by the application of a $2^{nd}$ pulse to the plateline of the F-RAM cell 102 having a peak voltage swept up or down from 0V to V2. As with the embodiment described above with reference to FIG. 7, the polarization of the ferro-capacitor 604 remains unswitched and the $2^{nd}$ pulse functions as a reference pulse to generate a reference voltage ($V_{BLB}$) on the reference line BLB of:

$$V_{BLB}=(V2*C_{FU})/(C_{FU}+C_{BLB})$$

where $V_{BLB}$ is the reference line voltage, V2 is the peak voltage of $2^{nd}$ pulse, $C_{BLB}$ is a capacitance of the reference line BLB, and $C_{FU}$ is a capacitance of the ferro-capacitor 104 in an unswitched (U-term) polarization state. The variable voltage of $2^{nd}$ pulse where is swept up and down from 0V to >V1, adds capability to measure the level of data voltage $P_{UD}^-$ or $U_{UD}^-$. It is further noted that because the ferro-capacitor 604 remains unswitched, this $2^{nd}$ pulse also functions as a clear pulse.

Finally, from time t4 to time t5 Wordline WL2 turns OFF reference transistor 608 decoupling the reference line BLB from the SN, and a SA enable signal is applied to the SA 610 by the processing element 210 to enable the data voltage ($U_{UD}^-$ or $P_{UD}^-$) on the bit-line BL and the reference voltage ($U_{UD}$) on the reference line BLB to be latched in the SA.

A read cycle to read a bit of data from the F-RAM cell of FIG. 6 according to yet another embodiment of the present disclosure will now be described in greater detail with reference to FIGS. 2, 6 and 9. As with the embodiments described above with reference to FIGS. 7 and 8, the memory device 600 and the F-RAM cell 602 are configured such that the additional bit-line capacitance ($C_{ADD}$) increases a total capacitance of the bit-line BL so that $(C_{BL}+C_{ADD}) \geq C_{BLB}$.

Figure 9:
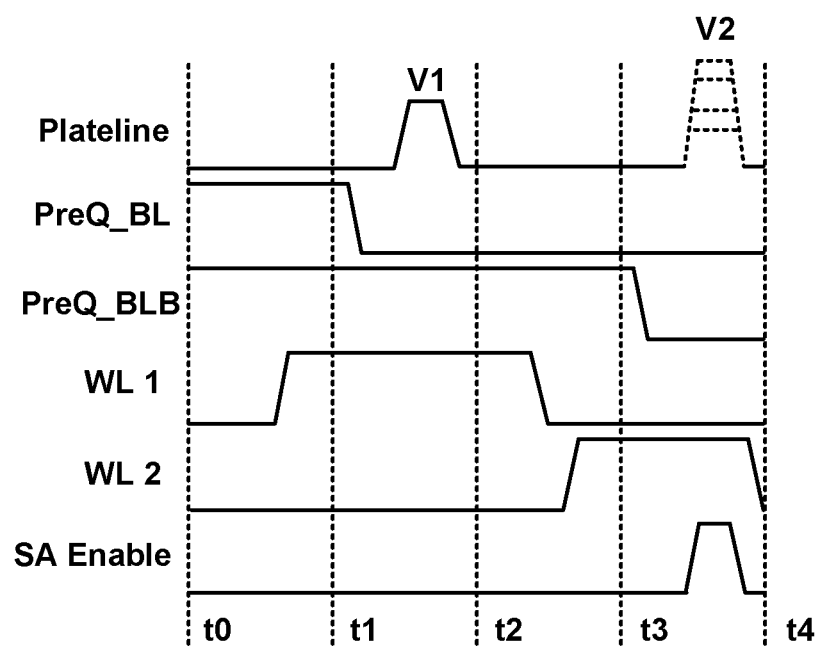
FIG. 9 is a timing diagram for describing yet another embodiment of a read cycle associated with the 2T1C F-RAM cell of FIG. 1 in which the memory device is configured to provide a margin sweep capability and simultaneous reference pulse and sense amplifier enable signals.

However, referring to FIG. 9, in this embodiment the memory device 600 and the F-RAM cell 602 are configured to provide a margin sweep capability in which the magnitude of the voltage of the $2^{nd}$ pulse is variable or swept from 0V to >V1, and the SA enable signal is applied to the SA 610 during or concurrent with the $2^{nd}$ pulse, thereby eliminating the period from time t4 to time t5, and increasing a frequency of operation of the memory device 600/200.

Referring to FIG. 9, at time t0 a PreQ_BL signal is applied to the bit-line pre-charge circuit 612 to pre-charge bit-line BL to a predetermined voltage, for example 0V.

From time t0 to time t1 a control signal WL1 is applied to turn ON access transistor 606, while bit-line pre-charge circuit 612 also remains ON, thereby discharging any residual internal voltage from the storage node SN.

From time t1 to time t2 the bit-line pre-charge circuit 612 is turned OFF to release the bit-line BL, followed by the application of a $1^{st}$ pulse having a peak voltage of V1 to the plateline of the F-RAM cell 602, resulting in a bit-line voltage ($V_{BL}$) equal to $(V1*C_F)/(C_F+C_{BL}+C_{ADD})$.

From time t2 to time t3 bit-line voltage $V_{BL}$ goes down from on-pulse data voltage to an after-pulse (up-down) data voltage ($U_{UD}^-$ or $P_{UD}^-$), depending on whether the polarization state of the ferro-electric material in the ferro-capacitor 604 has been switched, and wordline WL1 is turned OFF decoupling the bit-line BL from the SN, followed by applying a control signal to wordline WL2 to turn ON reference transistor 608. Reference line pre-charge circuit 614 remains ON to discharge any residual internal voltage from the storage node SN.

From time t3 to time t4 the reference line pre-charge circuit 614 is turned OFF to release the reference line BLB, followed by the application of a $2^{nd}$ pulse to the plateline of the F-RAM cell 602 having a peak voltage swept from 0V to >V1. Additionally, as described above the SA enable signal is applied to the SA 610 during or concurrent with the $2^{nd}$ pulse to enable the data voltage ($U_{UD}^-$ or $P_{UD}^-$) on the bit-line BL and the reference voltage ($U_{UO}^-$) to be latched in the SA 610, thereby eliminating the period from time t4 to time t5 and increasing a frequency of operation of the memory device 600/200. Finally, Wordline WL2 turns OFF reference transistor 608 decoupling the reference line BLB from the SN.

Figure 10:
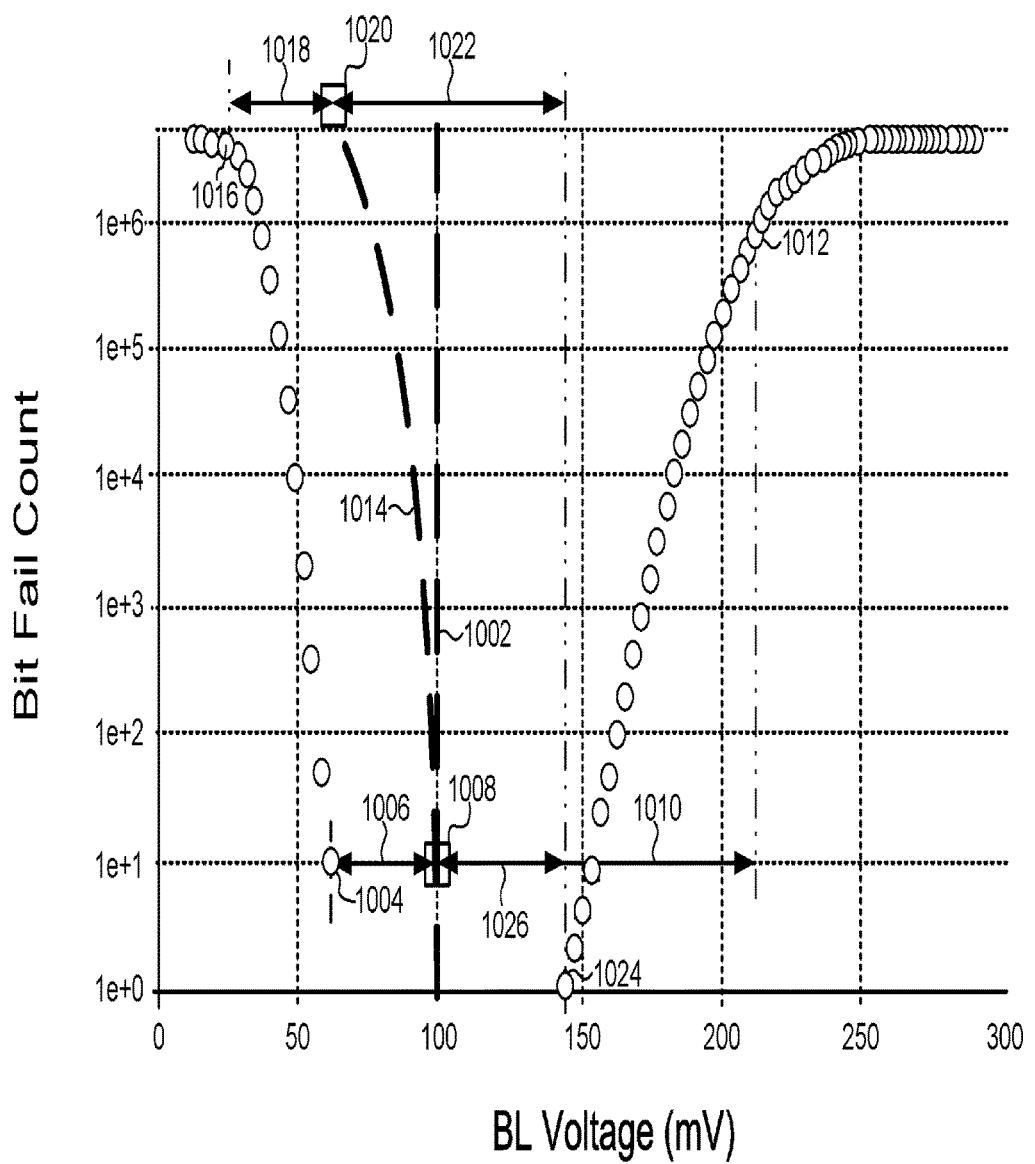
FIG. 10 is a plot illustrating improvement in F-RAM signal margin with an in-cell generated reference voltage that tracks the bit-level U-term versus a fixed, a global reference voltage.

FIG. 10 is a plot illustrating improvement in F-RAM signal margin with an in-cell generated reference voltage based on a bit-level U-term versus a fixed, a global reference voltage. Referring to FIG. 10 a bit-line voltage ($V_{BL}$) versus bit fail count, a global reference voltage is represented by line 1002 is programmed and placed in between the weakest U-term (one having the highest charge), and the weakest P-term (one having the lowest charge) of any F-RAM cell in the array of a memory device. For example, a memory device having signal margin at beginning-of-life (BOL) and using the global reference voltage, the effective U-term margin (illustrated by line 1006) to the generated global reference voltage (represented by line 1002) is against the first F-RAM cell 1004 having the weakest U-term (one having the highest charge), which is about 40 mV, while the effective P-term margin (illustrated by line 1026) to the generated global reference voltage (represented by line 1002) is against the $2^{nd}$ F-RAM cell 1024 having the weakest P-term (one having the lowest charge), which is about 50 mV.

A memory device having a signal margin at BOL and using an in-cell generated reference voltage based on a bit-level U-term, (represented by line 1014), the effective U-term margin (line 1006) of the first F-RAM cell 1004 to the generated reference voltage 1008 is also about 40 mV, however the effective P-term margin (line 1010) of this first F-RAM cell 1004 which is the same F-RAM cell 1012 to the generated reference voltage 1008 is about 110 mV. The effective U-term margin (line 1018) of the $2^{nd}$ F-RAM cell 1016 to the generated reference voltage 1020 is also about 40 mV, however the effective P-term margin (line 1022) of this $2^{nd}$ F-RAM cell 1016 which is the same F-RAM cell 1024 to the generated reference voltage 1020 is about 80 mV. The overall U-term margin of the device therefore is about 40 mV and the overall P-term margin of the device is about 80 mV.

Thus, it will be understood that even though the magnitude of the voltage V2 of the $2^{nd}$ pulse is set to fixed voltage throughout the life of the memory device, the generated reference voltage based on the U-term of the same cell tracks its changes whether due to temperature, endurance cycling, or data retention bake, therefore bit-level P-term signal margin remains to be maximized over the life of the device, extending the lifetime of the memory device. Moreover, the magnitude of the voltage V2 of the $2^{nd}$ pulse can be selected or set to provide further advantages over conventional F-RAM cell using a global reference voltage.

For example, in one embodiment voltage V2 of the $2^{nd}$ pulse can be selected or set to generate a minimum beginning-of-life (BOL) U-term signal margin, while maximizing the P-term signal margin, thereby increasing the memory device life that would otherwise be shortened by endurance cycling and data retention P-term degradation. In another embodiment, voltage V2 of the $2^{nd}$ pulse can be selected or set to generate a maximum BOL U-term signal margin, with a minimum end-of-life (EOL) P-term signal margin, thereby increasing a robustness of the memory device to reflow issues due to thermal depolarization. Alternatively, the voltage V2 of the $2^{nd}$ pulse can be selected or set to intermediate values in between those of the above embodiments to optimize both the life and the robustness of the memory device.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Thus, memory devices including a 2T1C F-RAM cells and methods of operating the same to improve F-RAM signal margins, timing application optimizing the frequency of operation, and to extend lifetime of the memory device have been disclosed. Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method comprising:
  discharging a storage node (SN) of a ferroelectric random access memory (F-RAM) cell by turning on a first transistor having a first source-drain (SD) terminal coupled to the SN and a second SD terminal coupled to a bit-line (BL);
  generating a data voltage on the BL by applying a first voltage pulse having a peak voltage of V1 to a plateline of a ferro-capacitor coupled between the plateline and the SN;
  decoupling the BL from the SN by turning off the first transistor;
  discharging the SN by turning on a second transistor having a first source-drain (SD) terminal coupled to the SN and a second SD terminal coupled to a reference bit-line (BLB); and
  generating a reference voltage on the BLB derived from an unswitched (U-term) of the ferro-capacitor of the F-RAM cell by applying a second voltage pulse having a peak voltage of V2 to the plateline.

2. The method of claim 1, further comprising:
  decoupling the BLB from the SN by turning off the second transistor; and
  coupling the data voltage on the BL and the reference voltage on the BLB to a sense amplifier (SA) to read data stored in the F-RAM cell.

3. The method of claim 1, wherein applying the second voltage pulse having the peak voltage of V2 to the plateline further serves as a clear pulse to harden the U-term in the ferro-capacitor.

4. The method of claim 1, wherein V2 is greater than V1.

5. The method of claim 1, further comprising coupling the BL to a bit-line pre-charge circuit and pre-charging the BL to a predetermined voltage prior to discharging the SN.

6. The method of claim 5, wherein discharging the SN comprises discharging the SN through the bit-line pre-charge circuit.

7. The method of claim 6 further comprising decoupling the BL from the bit-line pre-charge circuit prior to applying the first voltage pulse and wherein the bit-line pre-charge circuit remains electrically decoupled from the bit-line during a time between the first voltage pulse and the second voltage pulse.

8. The method of claim 1, wherein a bit-line capacitance is substantially equal to a reference bit-line capacitance.

9. The method of claim 1, wherein a bit-line capacitance is greater than a reference bit-line capacitance.

10. A method comprising:
  discharging a storage node (SN) of a ferroelectric random access memory (F-RAM) cell by turning on a first transistor having a first source-drain (SD) terminal coupled to the SN and a second SD terminal coupled to a bit-line (BL);
  generating a data voltage on the BL by applying a data pulse having a peak voltage of V1 to a plateline of a ferro-capacitor coupled between the plateline and the SN;
  decoupling the BL from the SN by turning off the first transistor;
  discharging the SN by turning on a second transistor having a first source-drain (SD) terminal coupled to the SN and a second SD terminal coupled to a reference bit-line (BLB); and generating a reference voltage on the BLB derived from an unswitched (U-term) of the ferro-capacitor of the F-RAM cell by applying a reference pulse to the plateline and sweeping the voltage of the reference pulse from a voltage less than V1 to a peak voltage of V2 greater than V1;

decoupling the BLB from the SN by turning off the second transistor; and coupling the data voltage on the BL and the reference voltage on the BLB to a sense amplifier (SA) to read data stored in the F-RAM cell, wherein applying the reference pulse to the plateline further serves as a clear pulse to harden the U-term in the ferro-capacitor.

11. The method of claim 10, further comprising coupling the BL to a bit-line pre-charge circuit and pre-charging the BL to a predetermined voltage prior to discharging the SN.

12. The method of claim 11, wherein discharging the SN comprises discharging the SN through the bit-line pre-charge circuit.

13. The method of claim 12 further comprising decoupling the BL from the bit-line pre-charge circuit prior to applying the data pulse and wherein the bit-line pre-charge circuit remains electrically decoupled from the bit-line during a time between the data pulse and the reference pulse.

14. The method of claim 10, wherein a bit-line capacitance is substantially equal to a reference bit-line capacitance.

15. The method of claim 10, wherein a bit-line capacitance is greater than a reference bit-line capacitance.

16. A method comprising:

discharging a storage node (SN) of a ferroelectric random access memory (F-RAM) cell by turning on a first transistor having a first source-drain (SD) terminal coupled to the SN and a second SD terminal coupled to a bit-line (BL);

generating a data voltage on the BL by applying a first voltage pulse having a peak voltage of V1 to a plateline of a ferro-capacitor coupled between the plateline and the SN;

decoupling the BL from the SN by turning off the first transistor;

discharging the SN by turning on a second transistor having a first source-drain (SD) terminal coupled to the SN and a second SD terminal coupled to a reference bit-line (BLB); and generating a reference voltage on the BLB derived from an unswitched (U-term) of the ferro-capacitor of the F-RAM cell by applying a second voltage pulse to the plateline and sweeping the voltage of the second voltage pulse from a voltage less than V1 to a peak voltage of V2 greater than V1, while concurrently coupling the data voltage on the BL and the reference voltage on the BLB to a sense amplifier (SA) to read data stored in the F-RAM cell.

17. The method claim 16, wherein applying the second voltage pulse further serves as a clear pulse to harden the U-term in the ferro-capacitor.

18. The method of claim 16, further comprising coupling the BL to a bit-line pre-charge circuit and pre-charging the BL to a predetermined voltage prior to discharging the SN.

19. The method of claim 18, wherein discharging the SN comprises discharging the SN through the bit-line pre-charge circuit.

20. The method of claim 19 further comprising decoupling the BL from the bit-line pre-charge circuit prior to applying the data pulse and wherein the bit-line pre-charge circuit remains electrically decoupled from the bit-line during a time between the data pulse and the reference pulse.

* * * * *